(12) United States Patent
Hatakeyama et al.

(10) Patent No.: US 7,649,213 B2
(45) Date of Patent: Jan. 19, 2010

(54) SEMICONDUCTOR DEVICE (75) Inventors: Tetsuo Hatakeyama, Yokohama (JP); Takashi Shinohe, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 459 days.

(21) Appl. No.: 11/234,238

(22) Filed: Sep. 26, 2005

(65) Prior Publication Data
US 2006/0065899 A1 Mar. 30, 2006

(30) Foreign Application Priority Data
Sep. 29, 2004 (JP) ............................. 2004-285245

(51) Int. Cl.
*H01L 29/861* (2006.01)
*H01L 29/872* (2006.01)
*H01L 29/74* (2006.01)
(52) U.S. Cl. .................. 257/127; 257/170; 257/484; 257/495; 257/605; 257/E29.012; 257/E29.013
(58) Field of Classification Search ........... 257/484, 257/127, 170, 452, 490, 494, 495, 605, E29.012, 257/E29.013
See application file for complete search history.

(56) References Cited

U.S. PATENT DOCUMENTS 4,602,266 A * 7/1986 Coe ........................ 257/495
4,912,064 A * 3/1990 Kong et al. ................. 438/507

FOREIGN PATENT DOCUMENTS

JP 2002-261295 9/2002
JP 2004-63860 2/2004

OTHER PUBLICATIONS

Kazuo Arai "Fundamentals and Application of SiC devices"; OHMSHA, Ltd.; Japan; pp. 165-169, Sep. 2003.

* cited by examiner

*Primary Examiner*—Lex Malsawma
(74) *Attorney, Agent, or Firm*—Oblon, Spivak, McClelland, Maier & Neustadt, L.L.P.

(57) ABSTRACT

A semiconductor device includes an SiC substrate, a normal direction of the substrate surface being off from a <0001> or <000-1> direction in an off direction, an SiC layer formed on the SiC substrate, a junction forming region formed in a substantially central portion of the SiC layer, a junction termination region formed to surround the junction forming region, and including a semiconductor region of a conductivity type different from the SiC layer formed as a substantially quadrangular doughnut ring, having two edges facing each other, each crossing a projection direction, which is obtained when the off direction is projected on the upper surface of the SiC layer, at a right angle, wherein a width of one of the two edges on an upper stream side of the off direction is L1, that of the other edge on a down stream side is L2, and a relation L1>L2 is satisfied.

5 Claims, 6 Drawing Sheets

SEMICONDUCTOR DEVICE

CROSS-REFERENCE TO RELATED APPLICATIONS

This application is based upon and claims the benefit of priority from prior Japanese Patent Application No. 2004-285245, filed Sep. 29, 2004, the entire contents of which are incorporated herein by reference.

BACKGROUND OF THE INVENTION

1. Field of the Invention

The present invention relates to a high-breakdown-voltage semiconductor device in which silicon carbide (SiC) is used as a substrate material.

2. Description of the Related Art

In a semiconductor power device, there are demands for a device structure and a device material for minimizing an on resistance and maximizing a breakdown voltage. Heretofore, to achieve a high-breakdown-voltage, an Si power device is prepared on an Si substrate, and a junction termination structure such as a RESURF or a guard ring is prepared in a device terminal end portion where an electric field is crowded. In respect of cost, there is a demand for a small area in a region required in the junction termination structure.

In recent years, a power device (SiC power device) made of an SiC material has been developed which surpasses performances of a power device made of an Si material by leaps and bounds. Since SiC is a wide band gap semiconductor, and an intensity of breakdown electric field is nearly ten times as large as that of Si, it is possible to improve tradeoff between the breakdown voltage and the on resistance of the power semiconductor device (e.g., "Fundamentals and applications of SiC devices", by Kazuo Arai, OHMSHA, LTD., Japan, pp 165 to 168).

In respect of quality of an SiC crystal, epitaxial growth of SiC is required in manufacturing an SiC substrate. An epitaxially grown film of SiC is grown on an SiC plane slightly tilted at a crystal angle from a <0001> direction referred to as a c-axis (e.g., U.S. Pat. No. 4,912,064).

However, SiC is an expensive semiconductor material as compared with Si. Therefore, the SiC power device is more disadvantageous than the Si power device in respect of the cost. Furthermore, even in the SiC power device, as well as in an Si power device, an electric field reducing structure is required which is a cause for a cost increase.

As described above, it is expected that the SiC power device can exhibit a performance higher than that of the Si power device, but there has been a problem in respect of the cost. Therefore, there has been a demand for realization of low cost SiC power devices.

BRIEF SUMMARY OF THE INVENTION

According to a first aspect of the invention, there is provided a semiconductor device, which comprises:

a silicon carbide substrate having a first main surface and a second main surface extending in parallel with each other, a direction of a normal of the substrate being off at an off angle from a <0001> or <000-1> direction in an off direction;

a silicon carbide layer of a first conductivity type formed on the first main surface of the silicon carbide substrate;

a junction forming region formed in a substantially central portion of an upper surface region of the silicon carbide layer;

a junction termination region formed so as to surround the junction forming region in the upper surface region of the silicon carbide layer, and including a semiconductor region of a second conductivity type formed as a substantially quadrangular doughnut ring, which has two edges facing each other and each crossing a projection direction, which is obtained when the off direction is projected on the upper surface region of the silicon carbide layer, at a right angle, wherein a width of one of the two edges of the semiconductor region on an upper stream side of the projection direction is L1, and a width of the other of the two edges on a down stream side is L2, and a relation L1>L2 is satisfied;

a first electrode selectively formed on an upper surface of the junction forming region; and a second electrode formed on the second main surface of the silicon carbide substrate.

According to a second aspect of the invention, there is provided a semiconductor device, which comprises:

a silicon carbide substrate of a first conductivity type having a first main surface and a second main surface extending in parallel with each other, a direction of a normal of the first main surface being off at an off angle from a <0001> or <000-1> direction in an off direction;

a silicon carbide layer of the first conductivity type formed on the first main surface of the silicon carbide substrate;

a junction forming region formed in a substantially central portion of an upper surface region of the silicon carbide layer;

a junction termination region formed so as to surround the junction forming region in the upper surface region of the silicon carbide layer, and including a semiconductor region of a second conductivity type formed as a substantially quadrangular doughnut ring, which has two edges facing each other and each crossing a projection direction, which is obtained when the off direction is projected on the upper surface region of the silicon carbide layer, at a right angle, wherein a width of one of the two edges of the semiconductor region on an upper stream side of the projection direction is L1, and a width of the other of the two edges on a down stream side is L2, and a relation L1>L2 is satisfied;

a first electrode formed on an upper surface of the junction forming region and forming a Schottky contact with the junction forming region; and a second electrode disposed in the second main surface of the silicon carbide substrate.

According to a third aspect of the invention, there is provided a semiconductor device, which comprises:

a silicon carbide substrate having a first main surface and a second main surface extending in parallel with each other, a direction of a normal of the first main surface being off at an off angle from a <0001> or <000-1> direction in an off direction;

a silicon carbide layer of a first conductivity type formed on the first main surface of the silicon carbide substrate;

a junction forming region formed in a substantially central portion of an upper surface region of the silicon carbide layer;

a junction termination region formed so as to surround the junction forming region in the upper surface region of the silicon carbide layer, and including a semiconductor region of a second conductivity type formed as a substantially quadrangular doughnut ring, which has two edges facing each other and each crossing a projection direction, which is obtained when the off direction is projected on the upper surface region of the silicon carbide layer, at a right angle, wherein a width of one of the two edges of the semiconductor region on an upper stream side of the projection direction is L1, and a width of the other of the two edges on a down stream side is L2, a relation L1>L2 is satisfied;

a well of a second conductivity type selectively formed in an upper surface of the junction forming region;

a source region of a first conductivity type selectively formed in an upper surface of the well;

a gate electrode formed on a portion of the well held between the source region and the silicon carbide layer outside the well via a gate insulating film;

a first electrode formed on an upper surface of the junction forming region insulatively from the gate electrode; and a second electrode formed on the second main surface of the silicon carbide substrate.

DETAILED DESCRIPTION OF THE INVENTION

According to embodiments of the present invention described hereinafter, since electric field concentration in a device terminal end portion can be reduced without forming any unnecessarily large junction termination region, junction termination regions can be reduced. By the reduction of the unnecessary junction termination regions, an SiC power device can be realized at a low cost.

The embodiments of the present invention will be described hereinafter with reference to the drawings.

First Embodiment

Figure 1:
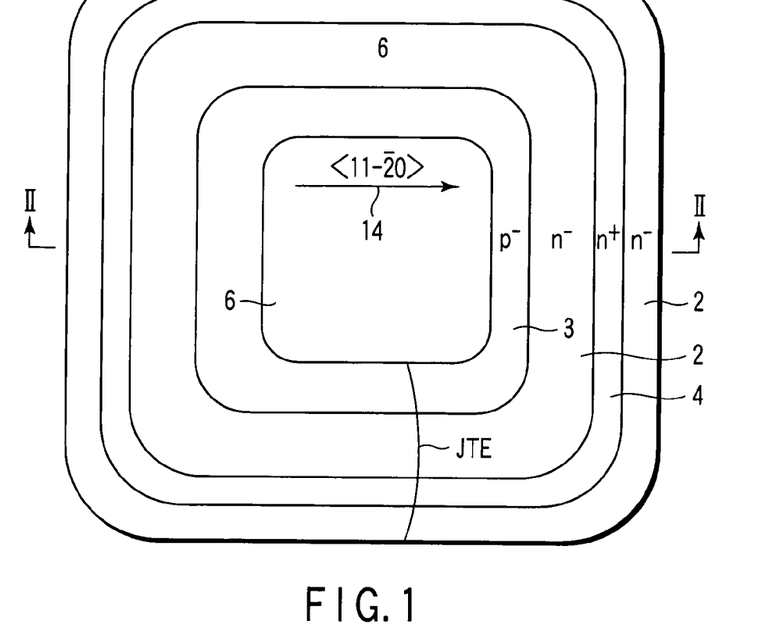
FIG. 1 is a plan view showing a high-breakdown-voltage semiconductor device according to a first embodiment of the present invention.
Figure 2:
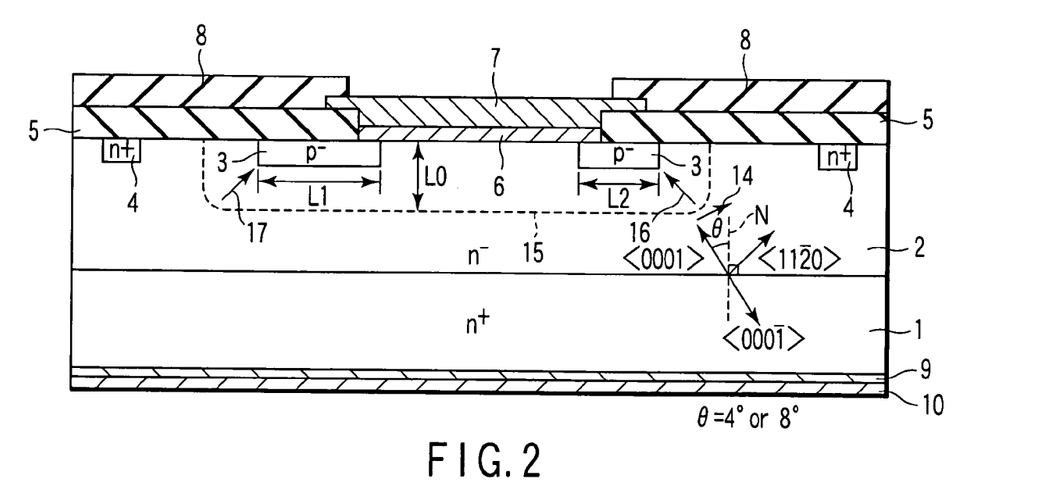
FIG. 2 is a sectional view along a line II-II of FIG. 1.

FIG. 1 is a plan view showing a high-breakdown-voltage semiconductor device according to a first embodiment of the present invention. FIG. 2 is a sectional view along a line II-II of FIG. 1. The high-breakdown-voltage semiconductor device of the present embodiment is provided with: a junction forming region in which an SiC Schottky diode is formed as an SiC power device; and a junction termination region including a RESURF region and a channel stopper region as junction termination structures.

In FIGS. 1 and 2, reference numeral 1 denotes an n-type SiC substrate having a high impurity concentration, and an n-type SiC layer 2 having a low impurity concentration is disposed on the surface of the n-type SiC substrate 1. The n-type SiC layer 2 is formed by an epitaxial growth process. That is, the layer is an epitaxially grown layer.

A main surface of the n-type SiC substrate 1 is provided with a normal N tilted (being off) at a predetermined off angle of usually 4° or 8° with respect to a <0001> direction. This normal N is referred to as an orientation, and a tilted direction is referred to as an off direction 14. In the first embodiment, this off direction 14 is a <11-20> direction. It is to be noted that symbol "-" in <11-20> means "-" (bar) affixed onto a numeral in crystallography.

Moreover, an axis of the <0001> direction is referred to as a c-axis. The n-type SiC layer 2 epitaxially grown on the n-type SiC substrate 1 is also provided with a normal (orientation) N tilted at 4° or 8° with respect to the <0001> direction or the c-axis.

A reason why the normal N of the main surface of the n-type SiC substrate 1 does not agree with the <0001> direction is that in a case where the normal N of the main surface of the SiC substrate 1 agrees with the <0001> direction, high-quality SiC does not epitaxially grow on the surface of the SiC substrate 1, and the high-quality n-type SiC layer 2 cannot be formed. For a similar reason, the normal N does not agree with a <000-1> direction.

A p-type RESURF region 3 having a low impurity concentration is formed in the surface of the n-type SiC layer 2. A plane figure of the p-type RESURF region 3 is a substantially rectangular ring shape, but does not have to be necessarily rectangular, and may be circular. Additionally, when RESURF and chip shapes are formed into substantially rectangular shapes, useless regions are so reduced that the number of chips obtained from a unit area on a wafer can be increased.

In the surface of the n-type SiC layer 2 outside the p-type RESURF region 3, an n-type channel stopper region 4 having a high impurity concentration is formed. An electrode for fixing potentials may be disposed on the n-type channel stopper region 4.

As shown in FIG. 1, the p-type RESURF region 3 and the n-type channel stopper region 4 are formed in a junction termination extension (JTE) which is the junction termination region.

Figure 3A:
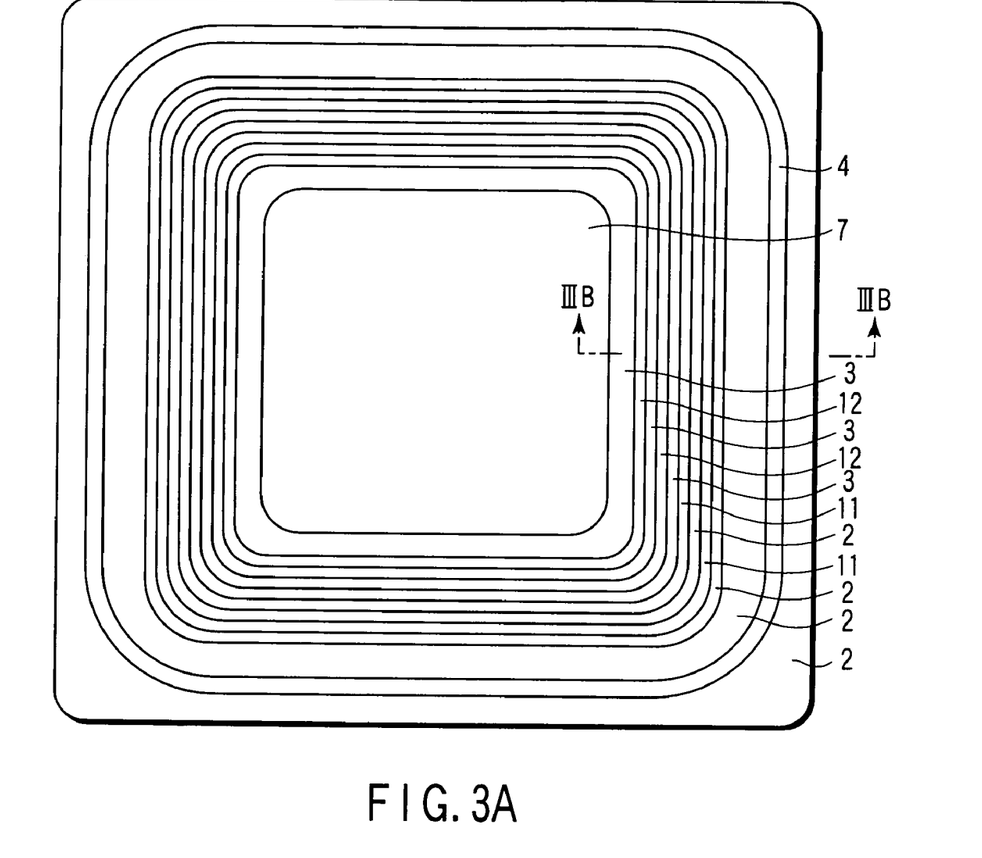
FIG. 3A is a plan view showing a modification of the high-breakdown-voltage semiconductor device of the first embodiment.
Figure 3B:
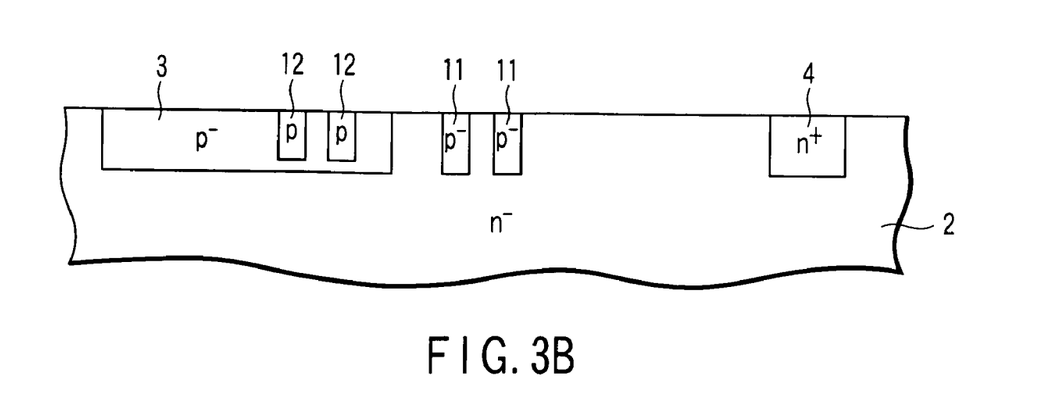
FIG. 3B is a sectional view along a line IIIB-IIIB of FIG. 3A.

In addition to the p-type RESURF region 3 and the n-type channel stopper region 4, as shown in FIGS. 3A and 3B, p-type guard ring regions (outside guard ring regions) 11 having low impurity concentrations may be disposed in the surface of the n-type SiC layer 2 between the p-type RESURF region 3 and the n-type channel stopper region 4. In addition to the p-type guard ring region 11, p-type guard ring regions (inner guard ring regions) 12 may be disposed further in the p-type RESURF region 3.

In the first embodiment, as shown in FIG. 2, a width L1 of the p-type RESURF region 3 on an upstream side of an off direction is longer than a width L2 of the p-type RESURF region 3 on a downstream side of an off angle direction (L1>L2).

It is to be noted that as described above, the off angle is an angle formed by a normal vector of the main surface of the wafer (semiconductor substrate) and a vector in a c-axis direction of the crystal. For example, an off angle of 8° in a <11-20> direction means that the normal vector of the main surface of the wafer tilts clockwise at 8 degrees from the c-axis vector of the crystal in the <11-20> direction.

In a conventional SiC Schottky diode having an equal breakdown voltage, the width L1 of the p-type RESURF region on the upstream side of the off direction is equal to the width L2 on the downstream side (i.e. L1=L2). In the present embodiment, L1>L2 is set. This reason will be described later.

A first insulating film 5 having an opening is disposed on the n-type SiC layer 2. The first insulating film 5 is, for example, an $SiO_2$-based insulating film (oxidized film).

A Schottky electrode 6 is disposed on the p-type RESURF region 3 and the n-type SiC layer 2 in the opening. That is, the Schottky electrode (first electrode) 6 is disposed in such a manner that an outer peripheral portion of the Schottky electrode 6 overlaps an inner peripheral portion of the p-type RESURF region 3. The Schottky electrode 6 is, for example, a Ti electrode. This Ti electrode has a thickness, for example, of 100 nm.

An Al electrode 7 for lowering a contact resistance on an anode side is disposed on the Schottky electrode 6. The Al electrode 7 has a thickness, for example, of 4 μm. As long as the contact resistance is lowered, there may be used an electrode material other than Al, for example, an electrode material having a low electric resistance, such as Au, Ag, or Cu. A second insulating film 8 is disposed on the outer peripheral portion of the Al electrode 7 and on the first insulating film 5. The second insulating film 8 is, for example, a polyimide-based insulating film.

On the other hand, a cathode electrode (second electrode) including an Ni electrode 9 and an Al electrode 10 are disposed on a back surface of the n-type SiC substrate 1. An Au electrode may be disposed further on the Al electrode 10 via a barrier metal. An anode electrode made of a material other than the above-described electrode materials may be used.

Next, the reason why L1>L2 is set with regard to the widths L1, L2 of the p-type RESURF region 3 will be described. In FIG. 2, a reference numeral 15 denotes a depletion layer in a case where a reverse bias is applied between the n-type SiC layer 2 and the Schottky electrode 6. Reference numerals 16, 17 denote the direction of electric fields crowded on corner portions of the RESURF region 3.

Moreover, SiC has anisotropy concerning the intensity of breakdown electric field. Specifically, silicon carbide has the strongest breakdown electric field in the c-axis direction and has the weakest breakdown electric field in a direction perpendicular to the c-axis. In the SiC substrate 1 whose orientation deviates from the <0001> direction, the intensity of the electric field 16 in the outer corner of the p-type RESURF region 3 on the downstream side of the off direction is substantially equal in the c-axis direction, and the intensity of the electric field 17 of the outer corner of the RESURF region 3 on the upstream side deviates largely from the c-axis. Therefore, the intensity of the electric field in the outer corner of the RESURF region 3 on the downstream side of the off direction is higher than that of the outer corner of the RESURF region 3 on the upstream side.

Therefore, an electric field reducing effect required in the p-type RESURF region 3 differs on the upstream and downstream sides of the off direction. Specifically, on the upstream side, the electric field reducing effect higher than that on the downstream side is required.

Since the intensity of the breakdown electric field is originally low in the outer corner of an upstream direction, the width L1 of the p-type RESURF region 3 needs to have a certain dimension. On the other hand, since the intensity of the breakdown electric field in the outer corner of a downstream direction is higher than that in the upstream direction, the width L2 of the p-type RESURF region 3 in the downstream direction can be set to be smaller than the width L1.

More specifically, the length of the RESURF region depends on the doping concentration of the SiC layer 2, and the length L0 of the depletion layer at the maximum breakdown electric field intensity is given as follows: $L0 = \in s * E_{BD}/(e*Nd)$, wherein $\in s$ is a dielectric constant of SiC layer 2, EBD is an intensity of breakdown electric field of SiC layer 2, e is an elementary electric charge, and Nd is a doping concentration of SiC layer 2.

Figure 8:
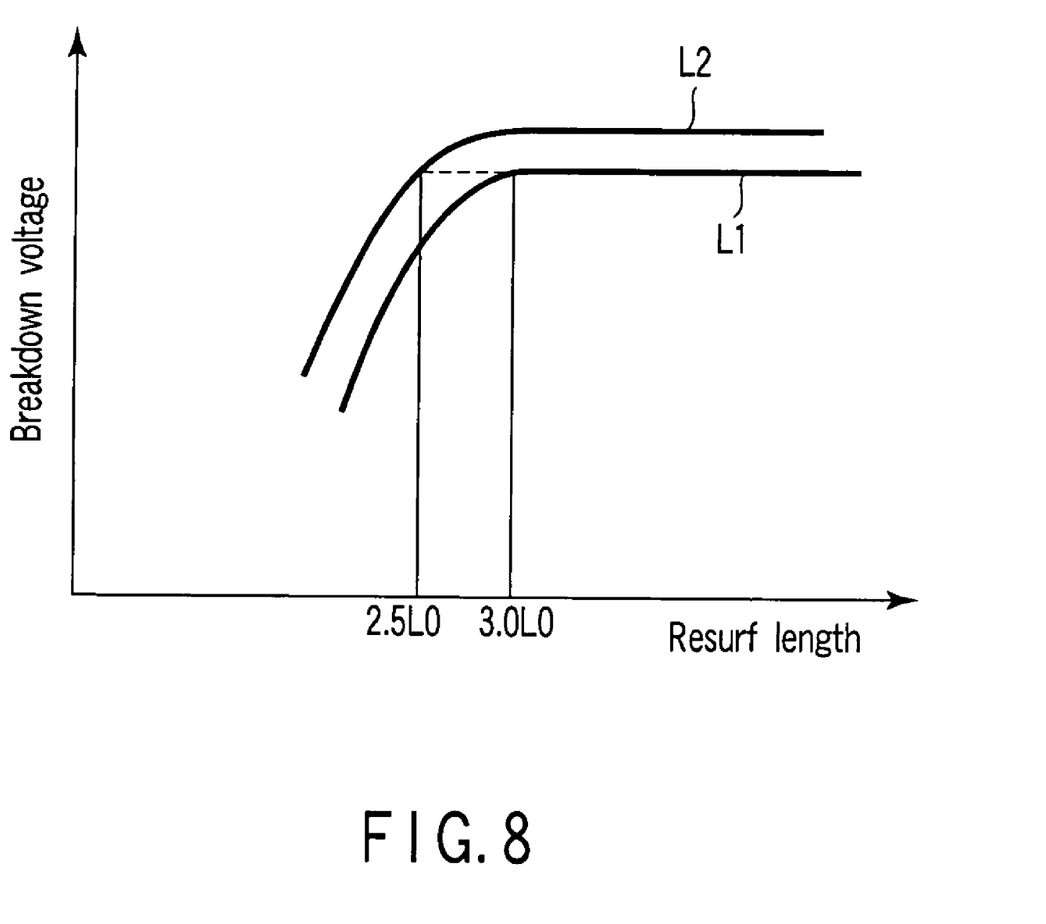
FIG. 8 is a graph showing the relation between the RESURF length and the breakdown voltage.

The relation between the RESURF length and the breakdown voltage is obtained by calculation as shown in FIG. 8. The breakdown voltage of L1 does not increase if its length increases over 3.0L0. Therefore, it suffices that the length of L2 is set to realize at least the limit breakdown voltage at L1=3.0L0. In other words, L2 is set larger than 2.5L0. In this case, however, it is effective to set L1>L2 in order to minimize the chip area, and to set L1>3.0L0 in order to secure the maximum breakdown voltage.

Therefore, in the present embodiment, L1>3.0L0, L2>2.5L0, and L1>L2 are set. The widths L1, L2 are set to be as small as possible within a range in which the required intensity of the breakdown electric field is secured. Accordingly, a ratio of the p-type RESURF region 3 (junction termination region) occupying the inside of the device can be reduced. When the ratio of the p-type RESURF region 3 is reduced, the number of chips (high-breakdown-voltage semiconductor devices) obtained from one wafer can be increased, and therefore manufacturing costs can be reduced. Also in the <000-1> direction, for a similar reason, the width of the p-type RESURF region 3 on the upstream side of the off direction may be set to be larger than that on the downstream side.

Figure 4:
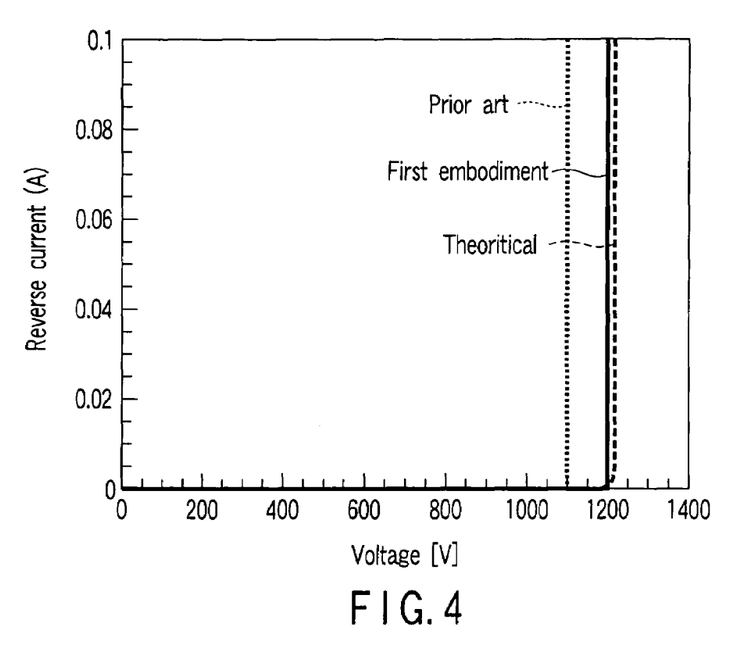
FIG. 4 is a characteristic diagram showing reverse current characteristics of the high-breakdown-voltage semiconductor device of the first embodiment and a conventional high-breakdown-voltage semiconductor device.

FIG. 4 shows reverse current characteristics of the high-breakdown-voltage semiconductor device of the present embodiment and a conventional high-breakdown-voltage semiconductor device. The abscissa indicates a voltage, and a portion in which a current value rises indicates a breakdown voltage.

In the high-breakdown-voltage semiconductor device of the present embodiment, L1>L2 is set. In the conventional high-breakdown-voltage semiconductor device, L1=L2 is set. Other parameters are the same. FIG. 4 also shows theoretical reverse current characteristics. It is seen from FIG. 4 that the high-breakdown-voltage semiconductor device of the present embodiment obtains characteristics close to the theoretical reverse current characteristics as compared with the conventional high-breakdown-voltage semiconductor device. Specifically, it is seen that a high-breakdown-voltage of 1200 V or more is obtained in the present embodiment.

As described above, according to the present embodiment, the widths of the p-type RESURF region 3 on the upstream and downstream sides of the off direction are set to values in accordance with the electric field reducing effect. Accordingly, electric field concentration in a device terminal end portion can be reduced without forming an unnecessarily large junction termination region JTE. Consequently, unnecessary junction termination regions can be reduced. Therefore, the costs can be reduced while utilizing characteristics such as a high-breakdown-voltage which is an advantage of the SiC power device.

When the guard ring regions are disposed as the junction termination structures, the number of the guard ring regions can be reduced, and the costs can be similarly reduced.

Second Embodiment

Figure 5:
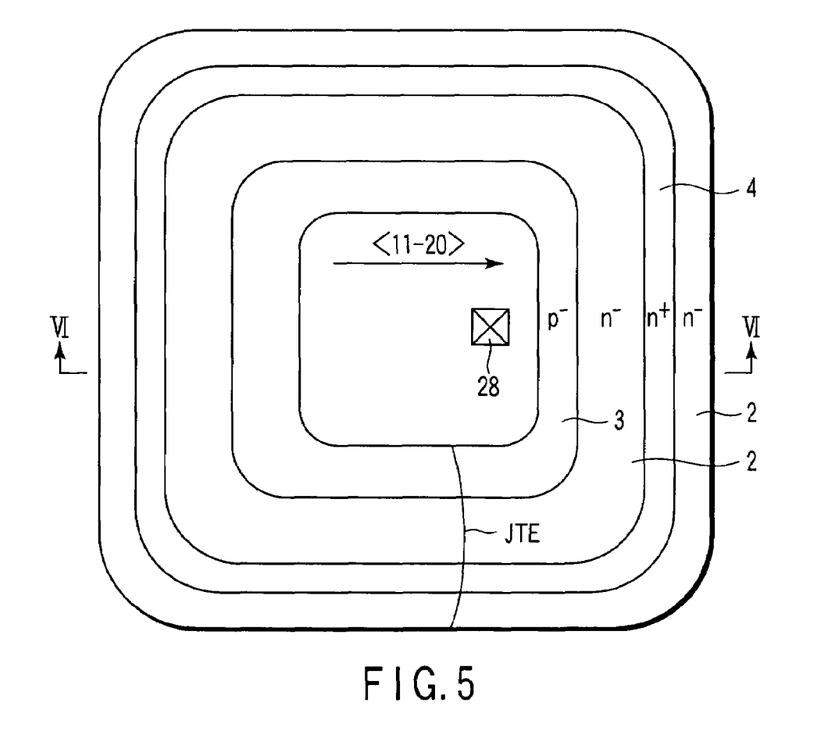
FIG. 5 is a plan view showing the high-breakdown-voltage semiconductor device according to a second embodiment of the present invention.
Figure 6:
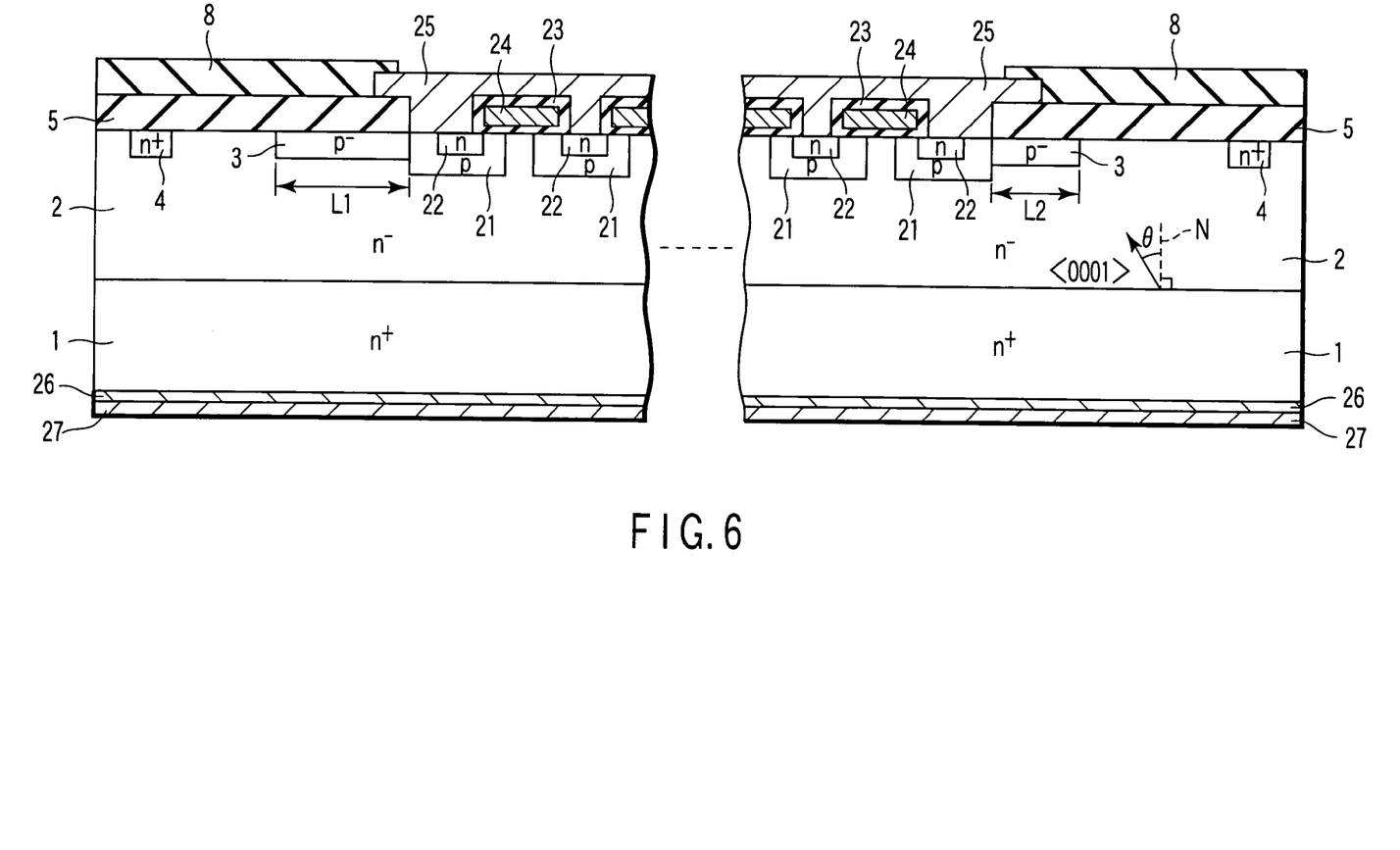
FIG. 6 is a sectional view along a line VI-VI of FIG. 5.

FIG. 5 is a plan view showing a high-breakdown-voltage semiconductor device according to a second embodiment of the present invention. FIG. 6 is a sectional view along a line VI-VI of FIG. 5. It is to be noted that in the figures, components corresponding to those of the first embodiment are denoted with the same reference numerals, and detailed description thereof is omitted.

The present embodiment is different from the first embodiment in that a power MOSFET is used instead of a Schottky diode. The present embodiment is provided with a RESURF region similar to that of the first embodiment, and for a reason similar to that of the first embodiment, different electric field intensities are applied to the layer on upstream and downstream sides of an off direction.

As shown in FIG. 6, p-type wells 21 are selectively formed in the surface of an n-type SiC layer 2, and n-type source layers 22 are selectively formed in the surfaces of the p-type wells 21. Each gate electrode 24 is disposed on each p-type well 21 held between the n-type source layer 22 and the n-type SiC layer 2 via a gate insulating film 23. Source electrodes 25 are disposed on the n-type source layers 22. The source electrodes 25 are also brought into contact with the p-type wells 21. On the other hand, a drain electrode including an Ni electrode 26 and an Al electrode 27 is disposed on a back surface of an n-type SiC substrate 1. It is to be noted that in FIG. 5, reference numeral 28 denotes a contact (gate contact) for each gate electrode 24.

According to the present embodiment, in the same manner as in the first embodiment, widths of a RESURF region 5 on upstream and downstream sides of an off direction are set to values in accordance with an electric field reducing effect. Accordingly, electric field crowding in a device terminal end portion can be reduced without forming an unnecessarily large junction termination region. Consequently, unnecessary junction termination regions can be reduced, and costs can be reduced while utilizing characteristics such as a high-breakdown-voltage which is an advantage of the SiC power device.

Third Embodiment

Figure 7:
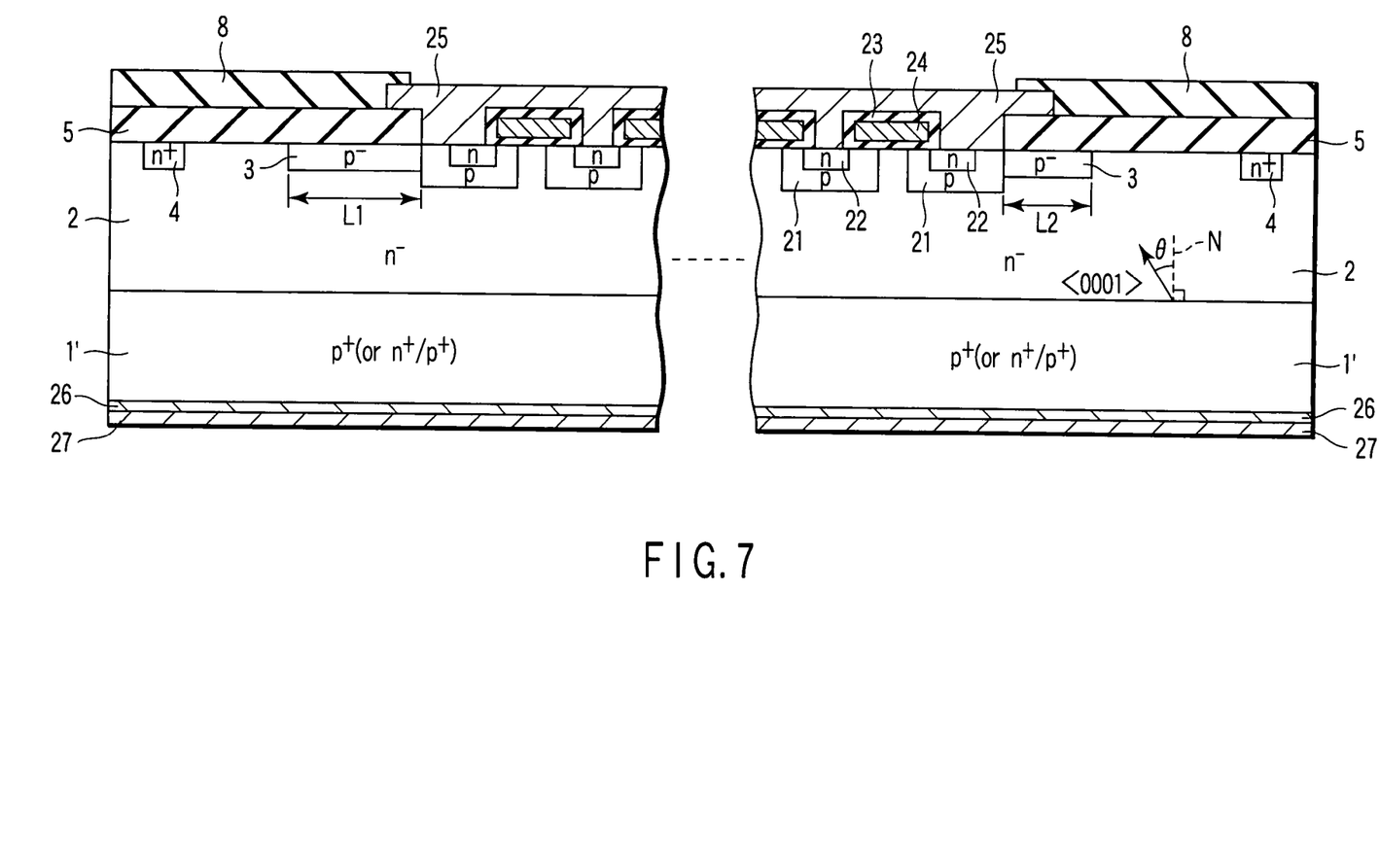
FIG. 7 is a sectional view showing the high-breakdown-voltage semiconductor device according to a third embodiment of the present invention.

FIG. 7 is a sectional view showing the high-breakdown-voltage semiconductor device according to a third embodiment of the present invention. The present embodiment is different from the first embodiment in that an IGBT is used instead of a Schottky diode.

Basically, the n-type SiC substrate 1 of the second embodiment is replaced with a p-type SiC substrate 1' to constitute the IGBT of the present embodiment. Instead of simply replacing the n-type SiC substrate 1 with the p-type SiC substrate 1', the substrate may be replaced with a substrate including an n-type SiC layer disposed on a p-type SiC layer, each having a high impurity concentration.

Also in the present embodiment, in the same manner as in the second embodiment, widths of a RESURF region 5 on upstream and downstream sides of an off direction are set to values in accordance with an electric field reducing effect, and unnecessary junction termination regions are reduced. Consequently, costs can be reduced while utilizing characteristics such as a high-breakdown-voltage which is an advantage of an SiC power device.

It is to be noted that the present invention is not limited to the above-described embodiments. For example, in the above-described embodiments, it has been described that the Schottky diode, MOSFET, and IGBT are used as the power devices, but the present invention is also applicable to power devices such as a PN diode and IEGT. Also in the above-described embodiments, the n-type has been described as a first conductivity type, and the p-type has been described as a second conductivity type. However, even when the conductivity type is reversed, the present invention can be similarly carried out.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a silicon carbide substrate having a first main surface and a second main surface extending in parallel with each other, a direction of a normal of the substrate being off at an off angle from a <0001> or <000-1> direction in an off direction;
    a silicon carbide layer of a first conductivity type formed on the first main surface of the silicon carbide substrate;
    a junction forming region formed in a substantially central portion of an upper surface region of the silicon carbide layer;
    a junction termination region formed so as to surround the junction forming region in the upper surface region of the silicon carbide layer, and including a semiconductor region of a second conductivity type formed as a substantially quadrangular doughnut ring, which has two edges facing each other with the junction forming region interposed therebetween and each crossing a projection direction, which is obtained when the off direction is projected on the upper surface region of the silicon carbide layer, at a right angle, wherein a width of one of the two edges of the semiconductor region on an upper stream side of the projection direction is L1, and a width of the other of the two edges on a down stream side is L2, and a relation L1>L2 is satisfied, in a condition that the one of the two edges and the other of the two edges are provided on the same semiconductor region formed as the substantially quadrangular doughnut ring;
    a first electrode selectively formed on an upper surface of the junction forming region; and
    a second electrode formed on the second main surface of the silicon carbide substrate,
    wherein L0 is a depletion layer length at the maximum breakdown voltage, and relationships L1>3.0L0 and L2>2.5L0 are satisfied, where said L0 has a relationship: $L0 = \in s * E_{BD}/(e*Nd)$, where $\in s$ is a dielectric constant of the silicon carbide layer, $E_{BD}$ is an intensity of a breakdown electric field, e is an elementary electric charge, and Nd is a doping concentration of the silicon carbide layer.

2. The semiconductor device according to claim 1, wherein the silicon carbide layer is an epitaxially grown layer having the same orientation as the silicon carbide substrate.

3. The semiconductor device according to claim 1, wherein the semiconductor region is a RESURF region.

4. The semiconductor device according to claim 3, wherein the RESURF region includes a guard ring formed therein.

5. The semiconductor device according to claim 1, wherein the junction termination region includes a guard ring.

* * * * *